United States Patent [19]

Slenkovich

[11] 4,153,951
[45] May 8, 1979

[54] EVENT MARKER HAVING EXTREMELY SMALL BIT STORAGE REQUIREMENTS

[75] Inventor: George L. Slenkovich, Campbell, Calif.

[73] Assignee: Itek Corporation, Lexington, Mass.

[21] Appl. No.: 726,392

[22] Filed: Sep. 24, 1976

[51] Int. Cl.$^2$ ............................................. G11C 19/00
[52] U.S. Cl. ................................................... 365/239
[58] Field of Search ..... 340/173 MP, 173 R, 173 SA; 364/200 MS File, 900 MS File, 200, 900; 365/230, 239

[56] References Cited

U.S. PATENT DOCUMENTS

| | | | |
|---|---|---|---|
| 3,241,123 | 3/1966 | Boucheron, Jr. | 364/200 |
| 3,646,526 | 2/1972 | Fagan et al. | 340/173 R |
| 3,651,491 | 3/1972 | Kobayashi | 340/173 SA |
| 3,812,473 | 5/1974 | Tucker | 364/200 |
| 3,851,313 | 11/1974 | Chang | 340/173 R |
| 3,855,580 | 12/1974 | Lighthall et al. | 340/173 R |

Primary Examiner—Gareth D. Shaw
Assistant Examiner—Michael C. Sachs
Attorney, Agent, or Firm—Homer O. Blair; Robert L. Nathans; Gerald H. Glanzman

[57] ABSTRACT

A plurality of random access memories (RAMS) are each addressed by a binary sub-number, all sub-numbers making up a composite binary address number, the maximum count of which defines the total number of subintervals within a given pulse repetition interval. The data output terminals of each RAM are coupled to an associated input terminal of an AND gate so that the AND gate produces an event mark once during each pulse repetition interval upon the detection of a bit readout of each RAM simultaneously during the particular subinterval when the event occurs.

7 Claims, 8 Drawing Figures

PRIOR ART

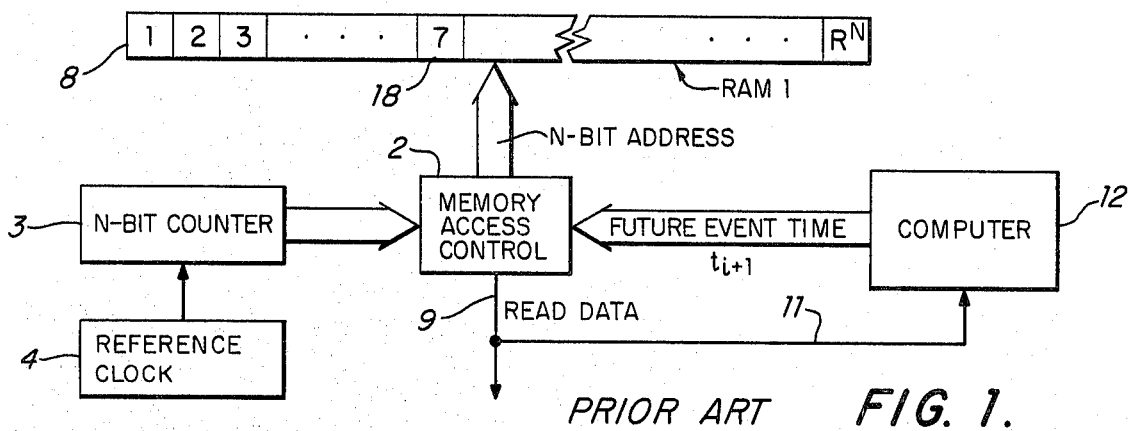
PRIOR ART  FIG. 1.
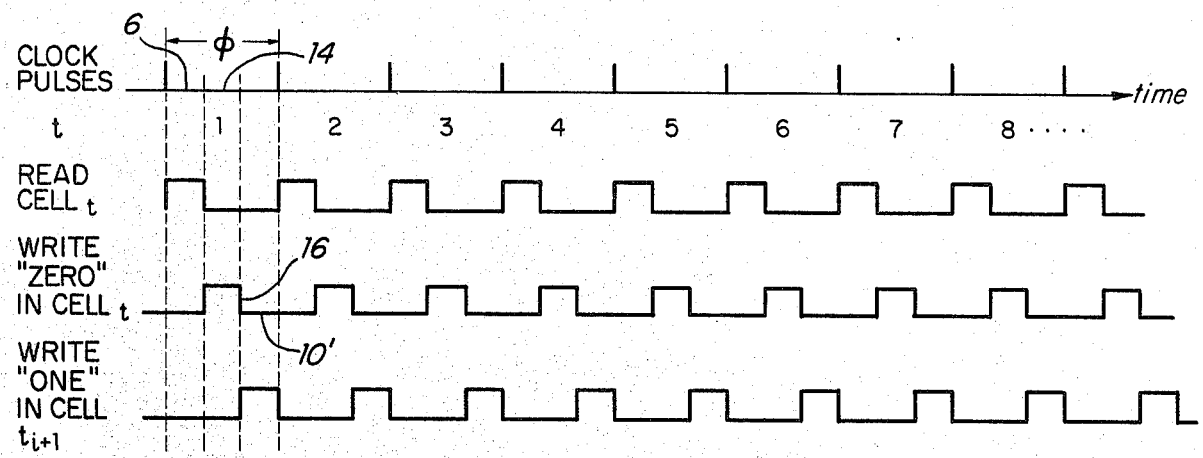
PRIOR ART  FIG. 2.
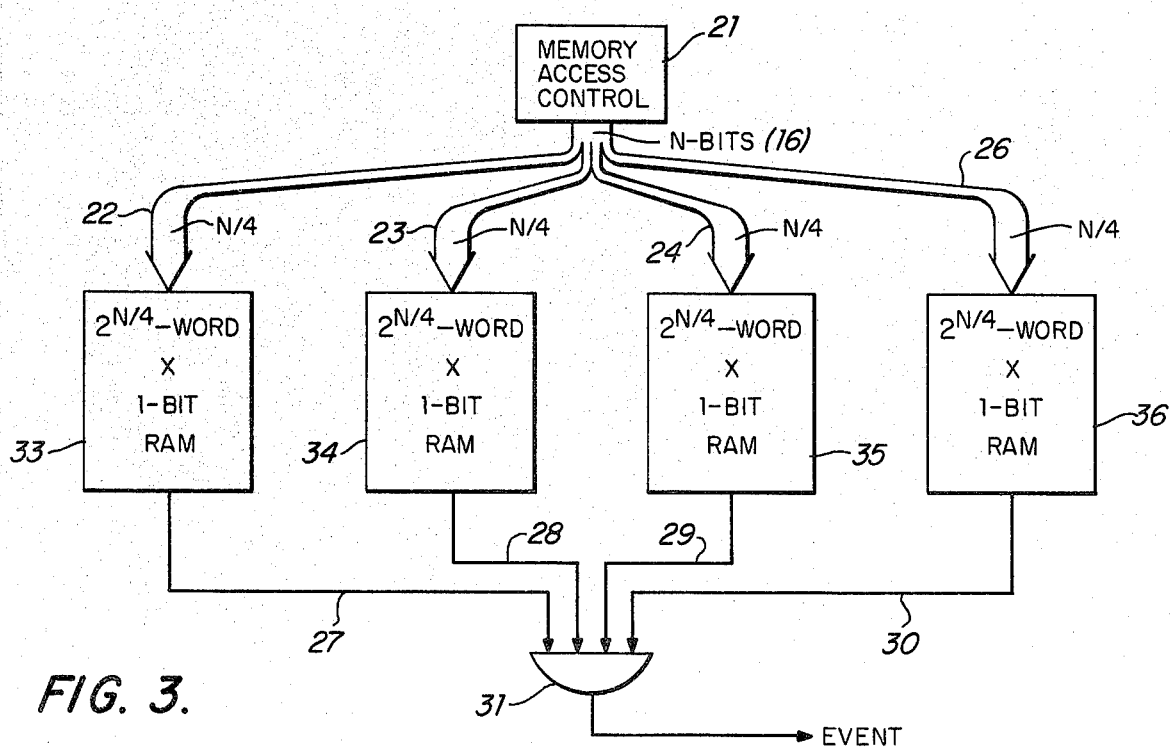
FIG. 3.

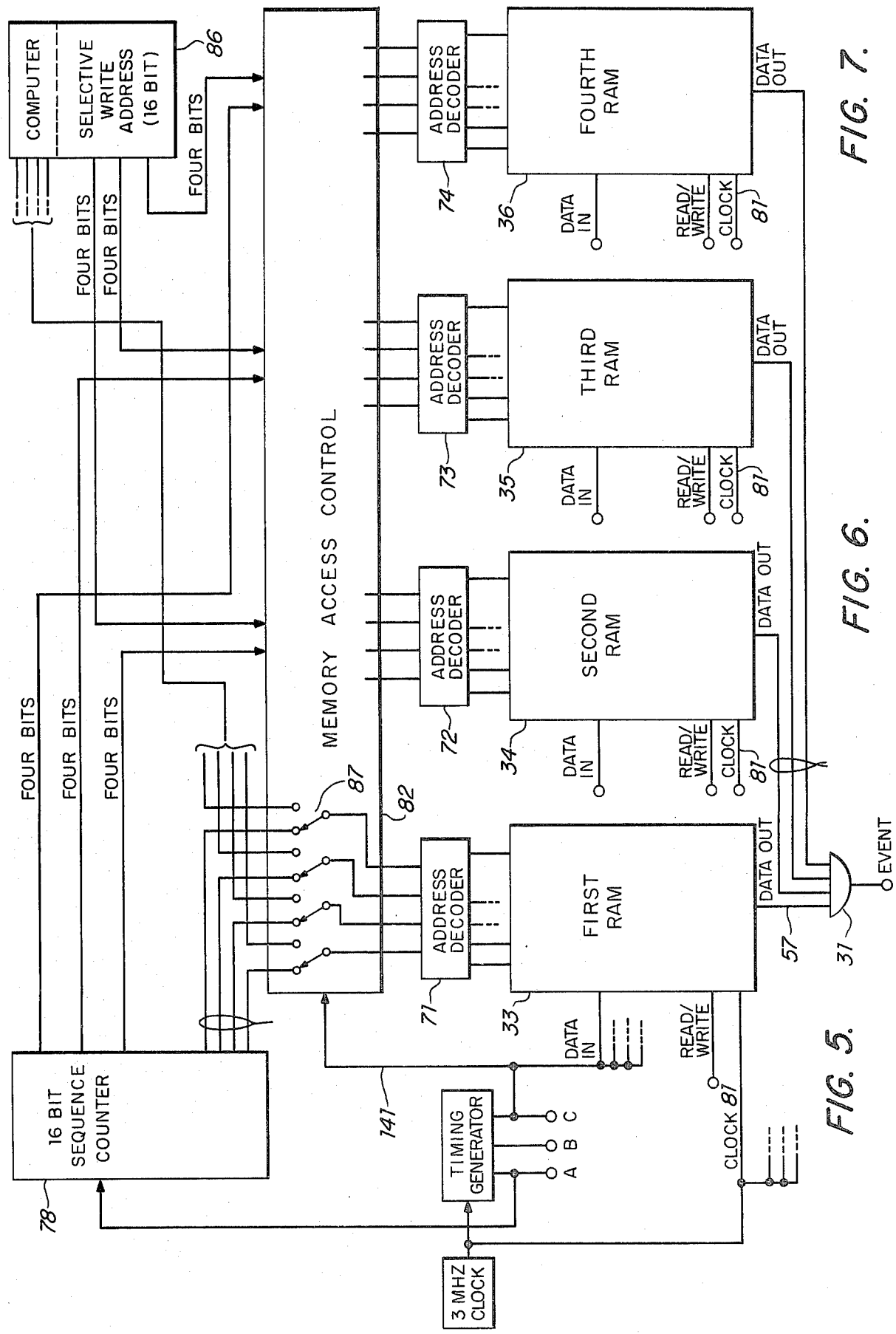

EVENT MARKER HAVING EXTREMELY SMALL BIT STORAGE REQUIREMENTS

BACKGROUND OF THE INVENTION

The event marker of the present invention is useful in connection with radar homing and warning systems. An aircraft may be illuminated by a series of radar RF bursts or impulses during particular sub-intervals or time slots within a series of pulse repetition intervals, and the production of what is known as an event marking output pulse during one time slot within each pulse repetition interval (PRI), is employed to generate a jamming signal to produce a retransmitted burst of RF energy, which will coincide with the predicted reception of the next incoming radar signal. Since the incoming impulses will often not be received within the same time slot during each PRI, it is often necessary for the computer to calculate changes in the predicted reception time of the next RF burst. In other words, the future event to be indicated or marked occupies a different time slot within each PRI since the phase and/or frequency of the series of impulses will be changing in a predictable manner. By measuring these changes, the computer is able to predict the occurence of the next RF burst or future event. This computer operation is well known by those in the radar homing and warning community, and the manner in which the computer operates is beyond the scope of this invention.

In accordance with the prior art, a random access memory (RAM) having a large number of cells or storage elements corresponding to the required number of subintervals examined for the occurrence of the event during each pulse repetition interval, is provided. A binary 1is inserted only into one of the cells. A memory access control circuit controlled by a binary address number produced by a binary counter sequentially scans all cells once during each pulse repetition interval, in order to detect the presence of a single binary 1 which indicates the occurrence in the event in time. Upon the detection of the binary 1, a "data out" lead of the RAM is marked to establish the occurrence of the event during the pulse repetition interval. At this time the just-addressed cell containing the binary 1 is cleared, and a binary 1 is either rewritten in such cell or written into another cell if a computer determines that the occurrence of the event in time is to changed. For example, a single RAM has been employed having 65,536 ($2^{16}$) cells, all of which are scanned once during one pulse repetition interval. The binary counter counts up to $2^{16}$ to effect each scan of the RAM. It is highly desirable to drastically reduce the number of storage elements of this RAM and yet fully maintain the above-mentioned function.

SUMMARY OF THE INVENTION

In accordance with a preferred embodiment of the invention, a plurality (e.g. four) of small capacity RAMS are each scanned under the control of a binary sub-number, e.g. four bits, of the above-mentioned binary address number, e.g. sixteen bits. Each sub-number controlling an associated RAM causes the scanning of the RAMS to occur at sharply differing rates so that the least significant binary sub-number coupled to a first RAM produces rapid scanning thereof, while the next more significant binary sub-number controls the second RAM to cause scanning at a slower rate, and so on with respect to the subsequent RAMS. A data output terminal of each RAM is marked only when a binary 1 is detected in the storage element being readout. The event detector includes an AND gate which is coupled to each data output terminal of each RAM, so that the AND gate produces an output event signal only upon the simultaneous detection of a binary 1 in all of the RAMS during the scanning process.

Other objects, features and advantages of the present invention will become apparent upon study of the following detailed description taken in conjunction with the drawings in which:

FIG. 1 schematically illustrates the above-mentioned prior art event marker;

FIG. 2 illustrates a pulse diagram which is useful in understanding the invention;

FIG. 3 schematically illustrates the overall system of an embodiment of the invention;

FIGS. 5-8 illustrate further details of a preferred embodiment of the invention including control circuity.

DETAILED DESCRIPTION

Figure 4:
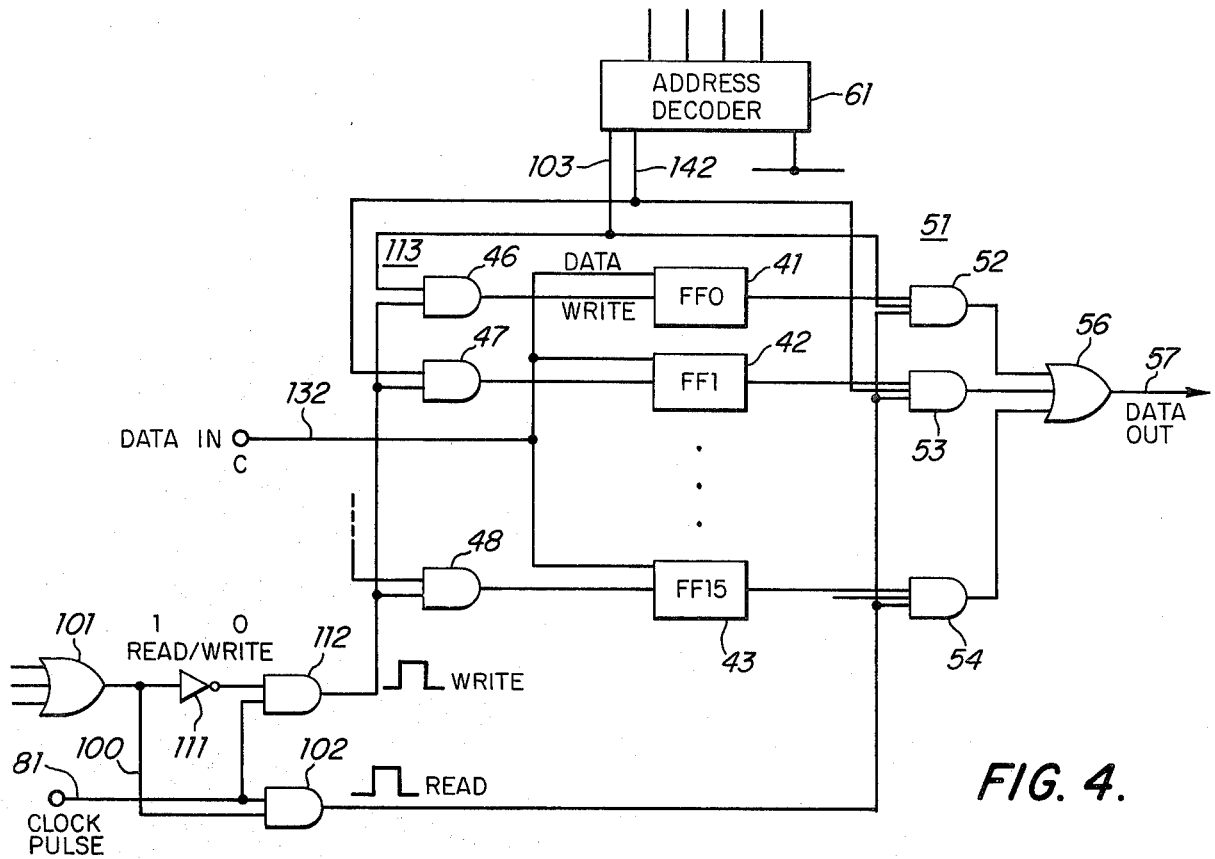
FIG. 4 illustrates the details of one RAM.

In accordance with the prior art system shown in FIG. 1, a random access memory 1 is controlled by memory access control circuit 2 which in turn is controlled by N bit counter 3 driven by reference clock 4. The pulse diagram of FIG. 2 illustrates the clock pulse generated by reference clock 4. Assuming a given PRI of 65 milliseconds and a 1 microsecond subinterval, $2^{16}$ or 65,536 cells are employed. Clock 4 generates a 1 megahertz pulse train to step the access control circuit each microsecond for each scanning step. A single binary 1 is written into one of the cells of RAM 1 and in no other. Bit counter 3 is set to 0 and commences counting up to $2^{16}$, thereby to cause memory access control circuit 2 to sequentially read the cells in memory 1. Each of the 1 microsecond subintervals is broken up into a first, second and third time slot. During the first time slot 6, of FIG. 2, a read pulse 7 is generated while memory access control circuit 2 is coupled to the first cell designated 8 in FIG. 1. If a binary 0 is in cell 1, an event signal is not generated on output conductor 9 coupled to computer 12 via lead 11. This process is repeated for each of the 65,536 subintervals during a given PRI. An event signal is only generated when the cell containing the binary 1 is scanned. Counter 3 is thereafter reset to 0 and the process is repeated. Thus, access control circuit 2 sequentially reads the cells in RAM 1 in order to detect the presence of the single binary bit stored therein.

Let it be assumed that access control circuit 2 detects a binary 1 in the 7th cell 18. In this case, an event signal is generated on output conductor 9 and is fed into computer 12. Since the binary 1 state is erased during the second time slot 14 of the 7th subinterval, it is necessary to reinsert the binary 1 bit either in the 7th cell 18 or in some other cell where it is desirable to change the position of the event being marked in time. For example, the computer may calculate that the binary bit should be inserted into another storage cell of RAM 1 rather than the 7th. This is accomplished by forwarding a binary address number representative of the desired cell to access control circuit 2, which during the third time slot 10', writes a 1 in the desired cell. Often, for certain applications, the computer is continually changing the position in time of the event pulse to be detected during each PRI.

In accordance with the present invention, an event marker is provided which drastically reduces the required number of memory devices required. For example, a 65,536 word (bit) performance was attained with merely 64 single bit storage elements, rather than 65,000 storage elements previously required.

In FIG. 3, memory access control circuit 21 produces a composite address binary number as in the case of access control circuit 2 of FIG. 1. However, the binary number is broken up into four binary sub-numbers, each represented by four bits, applied to groups of four leads 22, 23, 24 and 26, each group being coupled to a 16 storage bit RAM. The "data out" busses 27, 28, 29 and 30 are coupled to the four input terminals of AND gate 31 which comprises the event detector. While further detail of the contents of the four RAMS illustrated in FIG. 3 will be supplied hereinafter, it should be appreciated that the binary sub-numbers cause the sixteen storage devices within each RAM to be sequentialy addressed in a manner similar to the addressing of RAM 1. The least significant binary sub-number applied to RAM 33 will cycle between 0 and 16 and back to 0 and again up to 16, etc. The binary sub-number applied to RAM 34 will, of course, change at a much slower rate since this sub-number represents considerably more significant binary bits. Likewise, with respect to the binary sub-numbers applied to RAMS 35 and 36. Thus RAM 33 will be scanned many times relative to the scanning of RAM 34, and RAM 34 will be scanned many times relative to RAM 35. Only during one of the 65,536 subintervals will an output signal be applied to all four input terminals of AND gate 31 to produce an event signal on the output of AND gate 31.

In FIG. 4 a single RAM is disclosed having sixteen storage elements such as flipflops 41, 42 and 43. These sixteen storage elements have their write input terminals coupled to associted readin AND gates such as 46, 47 and 48 as illustrated. They also employ data input terminals which are coupled to "data in" conductor C. The output terminals of the flipflops are coupled to a bank of readout AND gates 51, each flipflop being coupled to an associated AND gate such as 52, 52 and 54. The output terminals of the sixteen readout AND gates are coupled to OR gate 56 which produces a "data out" signal on conductor 57, which in turn is coupled to the first input terminal of event marker AND gate 31 as shown in FIG. 5. Each RAM of FIG. 3 contains the above-described elements of FIG. 4. The memory access address control means 21 of the system includes four address decoders, 71–74, each being associated with a corresponding RAM as shown in FIGS. 5–7. Decoder 61 of FIG. 4, corresponding to 71 of FIG. 5, is addressed by an associated binary sub-number such as that produced on conductor group 22 in FIG. 3, to sequentially enable both the readin gates and the readout gates to produce sequential scanning of the RAM addressed.

RAMS 33, 34 and 36 of FIGS. 5–7 are each addressed by address decoders 71, 72, 73 and 74 respectively. A three megahertz clock pulse generator 76 is coupled to timing generator 77, which sequentially produces a mark on output conductors A, B and C each time a pulse is received from the three megahertz clock 76, so that the sequential marking of output conductors A, B and C is repeated at a one megahertz rate. A sixteen bit sequence counter 78 is coupled to output terminal A of timing generator 77, as shown in FIG. 5, to apply a one megahertz pulse train to sequence counter 78, so that the count in scanning sequence counter 78 is increased by one at a rate of one megahertz. The three megahertz clock 76 is coupled to the clock pulse input terminal 81 of each RAM. An access control switching circuit 82 causes the sequence counter 78 to be coupled to each address decoder during the first and second time slots of each subinterval. During the third time slot which is defined by the marking of terminal C of timing generator 77, all four groups of switching devices 87 will couple a selective write address circuit 86, of FIG. 7, within the computer, to the four address decoders during the third time slots. Each of the four binary sub-numbers produced by sequence counter 78 is thus applied in parallel to the four address decoders during the first and second time slots so that the systems commences to scan the subintervals for the purpose of detecting the presence of an event (binary one) which, in our example, occurs only in one subinterval. Since in the general case, a mark is not produced by detector AND gate 31 to indicate the event, the computer is not signalled to cause a fresh binary number to be inserted into the RAMS. However, upon the detection of an event, which only occurs when an output signal is generated by all four RAMS and applied to AND gate 31, the binary number generated by address circuit 86 of FIG. 7 will be recorded in the RAMS during the third time slot defined by the marking of terminal C of the timing generator. These operations are carried out by control circuitry illustrated in FIG. 8.

The control circuitry to be described below is operated in part by timing generator 77 which by sequentially marking its output conductors A, B and C defines the first, second and third time slot within each subinterval. During the first time slot, the readout AND gates 51 of all RAMs are enabled in order to ascertain whether an event mark is detected in all RAMS simultaneously in a given subinterval. If such is not the case, the addressed flipflop are not cleared or reset to 0 during the second time slot since the control circuitry does not permit enabling readin AND gates 113. If no event is detected, no new binary address code from computer address circuit 86 is read into the RAMS during the third time slot although the address decoders are coupled to circuit 86, and hence the bit pattern in the RAMS remain unchanged. On the other hand, if an event is detected during the first time slot, the control circuitry enables readin AND gates 113, which cause the addressed flipflops to be cleared or reset to 0 in preparation of the insertion of a fresh binary number into the RAMS. During the third time slot, the readin AND gates are enabled to permit this to occur.

Figure 8:
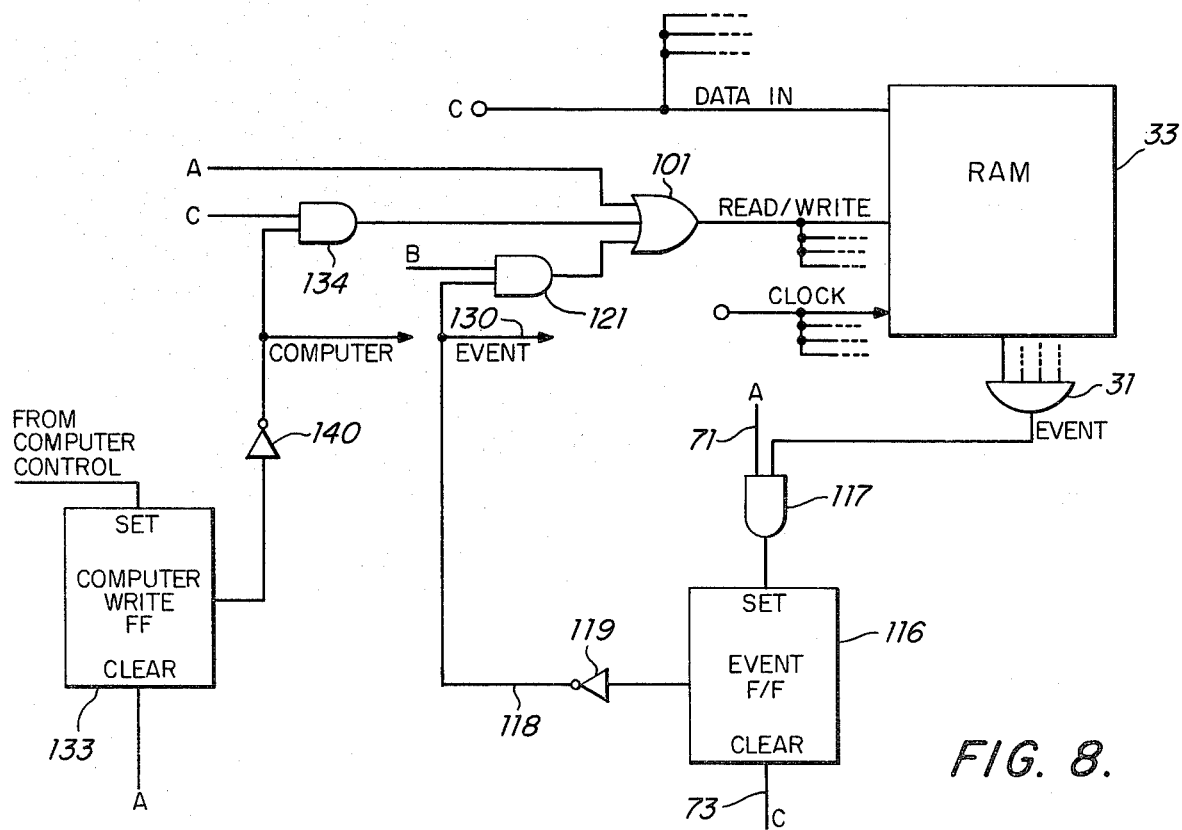

RAM 33 along with RAMS 34, 35 and 36 are coupled to the FIG. 8 control circuitry, and in the interest of clarity only one RAM is illustrated in FIG. 8, which should be studied particularly in conjunction with FIG. 4. As mentioned earlier, reading of the addressed cell or storage device is accomplished during the first time slot of each subinterval, which time slot is defined by the marking of terminal A of timing generator 77. The marking of terminal A causes a mark to be applied by OR gate 101 to the lower terminal of AND gate 102 of FIG. 4 via lead 100, and the readout AND gates 51 are thus enabled owing to the production of a clock pulse also applied to AND gate 102 via terminal 81. Let it be assumed that address decoder 61 of FIG. 4 produces a mark on its first output terminal 103 at this time, to in turn enable readin AND gate 46 and readout AND gate 52 both associated with the first flipflop 41. If a binary one is stored within the flipflop 41, a mark will be produced at the output terminal of OR gate 56 which represents a "data out" signal which is forwarded from the RAM to detector AND gate 31 over lead 57 illustrated in FIG. 5. If a binary 0 is stored in flipflop 41, the first terminal of AND gate 31 will not be marked as readout AND gate 52 is not fully enabled. During the first time slot, the action of inverter 111 of FIG. 4 disenables AND gate 112 so that a write-enable mark is not applied to the bank of readin AND gates 113 during the first time slot. During the second time slot only output terminal B of timing generator 77 is marked. Assuming that an event is not detected, event flipflop 116 will not be set during the first time slot since AND gate 117 only has its "A" terminal marked. This causes a binary one to be produced upon conductor 118 owing to the action of inverter 119 so that a bit is forwarded to OR gate 101 by the now enabled AND gate 121. The action of inverter 111 of FIG. 4 causes a binary 0 to be applied to AND gate 112 and thus the addressed flipflop cannot be reset to 0 since the readin AND gates are all disenabled during the second time slot. Only if an event is detected, all addressed RAM flipflops are cleared during the second time slot to prepare for recording a fresh binary number of the updated event in the flipflops during the third time slot. Assuming the detection of an event during the first time slot, AND gate 117 will cause event flipflop 116 to be set which in turn causes inverter 119 to apply a binary 0 to AND gate 121 which in turn causes inverter 111 to apply a binary one to the upper terminal of AND gate 112. This action enables readin AND gates 113 so that all addressed flipflops in all RAMS will assume the state of a binary 0, since flipflops are employed which assume whichever state is present on the input data bus. Since the data bus is not marked during the second time slot, all flipflops are cleared and reset to 0. In the above example only readin AND gate 46 of the RAM of FIG. 4 is fully enabled to mark the write terminal of the addressed flipflop 41. This causes the state of flipflop 41 to become 0 since a binary one is only applied to "data in" bus 132 during the third time slot when conductor C is marked with a binary one. The detection of an event is relayed to the computer over lead 130 which causes the computer to set computer write flipflop 133 of FIG. 8. Thus, it should be appreciated that normally, unless an event is detected, flipflop 133 is not set and a binary one is applied to AND gate 134 (owing to the action of inverter 140) which becomes fully enabled during the third time slot to disable AND gate 112 and in turn readin AND gates 113 so that a new binary number cannot be inserted into the RAMS in the absence of an event. In the usual case when no event is detected, the mark produced by AND gate 134 causes AND gate 112 to be disenabled (owing to the action of inverter 111) so that a selective write address code from the computer address circuit 86 of FIG. 7 is not inserted into the RAMS although address circuit 86 is coupled to the address decoders during the third time slot. This is because switches 87 are actuated by the marking of conductor 141 which actuates the switches upon the generation of a mark on terminal C on timing generator 77.

Now let it be assumed that an event has been detected during a particular subinterval. Unlike the situation described immediately above, it is now desired to write a fresh binary number generated by computer address circuit 86 into the just cleared storage elements. This is accomplished by the setting of computer write flipflop 133 during the first time slot. The generation of a event by AND gate 31 causes the computer to receive a signal over lead 130 wich is relayed back to flipflop 133. The binary one is inverted to a 0 by inverter 140, so that AND gate 134 is disenabled during the third time slot and thus inverter 111 of FIG. 4 causes AND gate 112 to now become fully enabled during the third time slot to enable all readin AND gates of all RAMS. The write address circuit 86 now causes address decoders 71, 72, 73 and 74 to fully actuate a new set of four flipflops in the case where the position of the event in time is to be changed. If the position of the event in time is to remain the same, binary ones are reinserted into the same flipflops which were just cleared during the second time slot.

While preferred embodiments of the invention have been described, the teachings of this invention will readily suggest many other embodiments to those skilled in the art.

What is claimed is:

1. An event marker used in the production of an event marker output pulse during time slots within a pulse repetition interval comprising:
   a. N groups of storage devices, wherein N is an integer greater than one;
   b. recording means for recording a bit in a single selected storage device of each group of said N groups of storage devices;
   c. first readout means for sequentially reading the storage devices of a first group of said storage devices at a first rate for detecting the presence of said bit in said first group of said storage devices;
   d. second readout means for sequentially reading the storage devices of a second group of said storage devices at a second rate, less than said first rate, for detecting the presence of said bit in said second group of said storage devices;
   e. $N^{th}$ readout means for sequentially reading the storage devices of an $N^{th}$ group of said storage devices at an $N^{th}$ rate, less than said second rate, for detecting the presence of said bit in said $N^{th}$ group of said storage devices; and,
   f. and gate means, coupled to said first, second and $N^{th}$ readout means for detecting the simultaneous reading of said bit in each and every group of said N groups of storage devices.

2. The combination as set forth in claim 1 wherein said first, second and $N^{th}$ readout means each include a bank of readout and GATES each having first and second input terminals and an output terminal;
   a. said detector means further comprising an AND gate having a first input terminal coupled to all of the output terminals of the AND gates of said first readout means, a second input terminal coupled to all of the output terminals of the AND gates of said second readout means, and an $N^{th}$ input terminal coupled to all of the output terminals of the AND gates of said $N^{th}$ readout means;
   b. address means having a plurality of output terminals which are sequentially pulsed, the first input terminal of each of said readout AND gates being coupled to associated ones of said output terminals of said address means, so that the actuation of said address means sequentially enables said readout gates; and
   c. means for coupling each of said second input terminals of each of said readout AND gates to an associated storage device within said N groups of storage devices.

3. The combination as set forth in claim 2 wherein said recording means further includes a plurality of readin AND gates, each having a first and second input terminal and an output terminal coupled to the control terminal of an associated storage device of said N groups of storage devices;
   a. means for coupling each of said first input terminals of said readin AND gates to an associated output terminal of said address means so that said readin AND gates are sequentially enabled thereby; and
   b. control means coupled to said second input terminals of each of said readin AND gates for controlling the states of the storage devices of said N group of storage devices, and further including means coupled between said control means and all of said readout AND gates for enabling the selective readout of the states of said storage devices to said detetor means.

4. The combination as set forth in claim 1 wherein said first readout means further includes a first address decoder for sequentially pulsing a plurality of output terminals thereof as a function of the changing value of a first binary sub-number applied as an input to said second address decoder;
   a. and wherein said second readout means further includes a second address decoder for sequentially pulsing a plurality of output terminals thereof as a function of the changing value of a second binary subnumber applied as an input thereto;
   b. and wherein said $N^{th}$ readout means further includes an $N^{th}$ address decoder for sequentially marking a plurality of output terminals thereof as a function of the changing value of an $N^{th}$ binary sub-number applied as an input thereto;
   c. a sequence counter for generating an access control binary number which comprises all of said binary sub-numbers, and wherein said $N^{th}$ binary sub-number is more significant than said second binary sub-number and wherein said second binary sub-number is more significant than said first binary sub-number, thereby to establish the different rates of readout of each of said groups of storage devices; and,
   d. means for coupling said sequence counter to said first, second and $N^{th}$ address decoders.

5. The combination as set forth in claim 2 wherein said address means further includes a first address decoder for sequentially pulsing a plurality of output terminals thereof as a function of the changing value of a first binary sub-number applied as an input thereto, a second address decoder for sequentially pulsing a plurality of output terminals thereof as a function of the changing value of a second binary sub-number applied as an input thereto, an $N^{th}$ address decoder for sequentially pulsing a plurality of output terminals thereof as a function of the changing value of an $N^{th}$ binary sub-number applied as an input thereto;
   a. a sequence counter for generating an access control binary number which comprises said binary sub-numbers, and wherein said $N^{th}$ binary sub-number is more significant than said second binary sub-number and wherein said second binary sub-number is more significant than said first binary sub-number, thereby to establish the different rates of readout of each of said groups of storage devices; and,
   b. means for coupling said sequence counter to said first, second and $N^{th}$ address decoders.

6. The combination as set forth in claim 3 wherein said address means further includes a first address decoder for sequentially marking a plurality of output terminals thereof as a function of the changing value of a first binary sub-number applied as an input thereto, a second address decoder for sequentially marking a plurality of output terminals thereof as a function of the changing value of a second binary sub-number applied as an input thereto, an $N^{th}$ address decoder for sequentially marking a plurality of output terminals thereof as a function of the changing value of an $N^{th}$ binary sub-number applied as an input thereto;
   a. a sequence counter for generating an access control binary number which comprises said binary sub-numbers, and wherein said $N^{th}$ binary sub-number is more significant than said second binary sub-number and wherein said second binary sub-number is more significant than said first binary sub-number, thereby to establish the different rates of readout of each of said groups of storage devices; and,
   b. means for coupling this sequence counter to said first, second and $N^{th}$ address decoders.

7. The combination as set forth in claim 2 wherein said recording means further includes a plurality of readin AND gates, each having a first and second input terminal and an output terminal coupled to the control terminal of an associated storage device of said N groups of storage devices;
   a. means for coupling each of said first input terminals of said readin AND gates to an associated output terminal of said address means so that said readin AND gates are sequentially enabled thereby; and,
   b. control means coupled to said second input terminals of each of said readin AND gates for controlling the states of the storage devices of said N group of storage devices, and further including means coupled between said control means and all of said readout AND gates for enabling the selective readout of the states of said storage devices to said detector means.

* * * * *